United States Patent [19]
Bozada et al.

[11] Patent Number: 5,698,900
[45] Date of Patent: Dec. 16, 1997

[54] FIELD EFFECT TRANSISTOR DEVICE WITH SINGLE LAYER INTEGRATED METAL AND RETAINED SEMICONDUCTOR MASKING

[75] Inventors: Christopher A. Bozada, Dayton; Tony K. Quach, Kettering; Kenichi Nakano; Gregory C. DeSalvo, both of Beavercreek; G. David Via; Ross W. Dettmer, both of Dayton; Charles K. Havasy; James S. Sewell, both of Kettering; John L. Ebel, Beavercreek; James K. Gillespie, Cedarville, all of Ohio

[73] Assignee: The United States of America as represented by the Secretary of the Air Force, Washington, D.C.

[21] Appl. No.: 684,734

[22] Filed: Jul. 22, 1996

[51] Int. Cl.$^6$ .......................... H01L 23/48; H01L 23/52; H01L 29/40

[52] U.S. Cl. .......................... 257/744; 257/472; 257/330; 257/288; 257/494

[58] Field of Search .................. 257/194, 744, 257/472

[56] References Cited

U.S. PATENT DOCUMENTS

| | | | |
|---|---|---|---|
| 3,764,865 | 10/1973 | Napoli et al. | 317/235 |
| 3,855,690 | 12/1974 | Kim et al. | 29/571 |
| 3,861,024 | 1/1975 | Napoli et al. | 29/579 |
| 3,943,622 | 3/1976 | Kim et al. | 29/579 |
| 4,961,194 | 10/1990 | Kuroda et al. | 357/22 |
| 5,021,857 | 6/1991 | Suehiro | 357/42 |
| 5,041,393 | 8/1991 | Ahrens et al. | 437/58 |
| 5,091,259 | 2/1992 | Shih et al. | 357/22 |
| 5,288,654 | 2/1994 | Kasai et al. | 437/41 |
| 5,312,765 | 5/1994 | Kanber | 437/22 |
| 5,352,909 | 10/1994 | Hori | 257/76 |
| 5,521,403 | 5/1996 | Usui et al. | 257/192 |

OTHER PUBLICATIONS

*Ohmic Contacts to n–GaAs Using Graded Band Gap Layers of $Ga_{1-x}In_x$ As Grown by Molecular Beam Epitaxy*, authorized by J.M. Woodall et al., p. 626 in the J. Vac. Sci. Technol. vol. 19, No. 3, Sep./Oct. 1981.

*HEMT with Nonalloyed Ohmic Contacts Using $n^+$ –InGaAs Cap Layer*, authorized by S. Kuroda et al., p. 389 in the IEEE Electron Device Letters, vol. EDL-8, No. 9, Sep. 1987.

*Extremely Low Nonalloyed and Alloyed Contact Resistance Using an InAs Cap Layer on InGaAs by Molecular–Beam Epitaxy*, authored by C.K. Peng et al., p. 429 in the J. Appl. Phys. vol. 64, No. 1, Jul. 1, 1988.

*Non–Alloyed Ohmic Contacts to n–GaAs Using Compositionally Graded $In_xGa_{1-x}As$ Layers*, authored by T. Nittono et al., pp. 1718–1722 in the Japanese Journal of Applied Physics, vol. 27, No. 9, Sep. 1988.

*Extremely Low Contact Resistances for AlGaAs/GaAs Modulation–Doped Field–Effect Transistor Structures*, Authored by A. Ketterson et al., p. 2305 in the J. Appl. Phys. vol. 57, No. 6, Mar. 1985.

(List continued on next page.)

Primary Examiner—Sara W. Crane
Assistant Examiner—Douglas A. Wille
Attorney, Agent, or Firm—Gerald B. Hollins; Thomas L. Kundert

[57] ABSTRACT

A periodic table group III–IV field-effect transistor device is described. The disclosed device uses a single metalization for ohmic and Schottky barrier contacts, permanent plural etch stop layers, employs a non-alloyed ohmic connection semiconductor layer and includes a permanent semiconductor material-comprised secondary mask element, a mask element which can be grown epitaxially during wafer fabrication to perform useful functions in both the device processing and device utilization environments. The device of the invention may be achieved with both an all optical lithographic process and a combined optical and electron beam lithographic process. The disclosed device provides a field-effect transistor of reduced fabrication cost, increased dimensional accuracy and state of the art electrical performance.

22 Claims, 4 Drawing Sheets

OTHER PUBLICATIONS

*Single–Cycle Lithography Process for Both Large and Sub–Half Micron Features*, authorized by J.S. Sewell et al., p. 177 in the SPIE, vol. 1671, 1992.

*A Combined Electron Beam/Optical Lithography Process Step for the Fabrication of Sub–Half–Micron–Gate–Length MMIC Chips*, authorized by J.S. Sewell et al., and appearing in the Conference Proceedings of the Fourth National Technology Transfer Conference and Exposition, Dec. 7–9, 1993, Anaheim, California, NASA Conference Publication 3249, vol. 1, p. 54.

*Etch Rates and Selectivities of Citric Acid/Hydrogen Peroxide on GaAs, $Al_{0.3}Ga_{0.7}As$, $In_{0.2}Ga_{0.8}As$, $In_{0.53}Ga_{0.47}As$, $In_{0.52}Al_{0.48}As$, and InP*, authored by G.C. DeSalvo et al., p. 831 in the J. Electrochem. Soc., vol. 9, No. 3, Mar. 1992.

*Citric Acid Etching of $GaAs_{1-x}Sb_x$, $Al_{0.5}Ga_{0.5}Sb$, and InAs for Heterostructure Device Fabrication*, authored by G.C. DeSalvo et al., p. 3526 in the J. Electrochem. Soc., vol. 141, No. 12, Dec. 1994.

*High–Performance Self–Aligned $p^+/n$ GaAs Epitaxial JFET's Incorporating AlGaAs Etch–Stop Layer*, authored by J.K. Abrokwah et al., p. 1529 in the IEEE Transactions on Electron Devices, vol. 37, No. 6, Jun. 1990.

*Making a High–Yield, 0.33 Micron, MBE–Based GaAs MMIC Production Process*, authored by R.D. Remba et al., p. 90 in the proceedings of the 1994 U.S. Conference on GaAs Manufacturing Technology (MANTECH), May 1994.

*Simplified Ohmic and Schottky Contact Formation for Field Effect Transistors Using the Single Layer Integrated Metal Field Effect Transistor (SLIMFET) Process*, authored by G.C. DeSalvo et al., p. 314 in the IEEE Transactions on Semiconductor Manufacturing, vol. 8, No. 3, Aug. 1995.

*All–Refractory GaAs FET Using Amorphous $TiWSi_x$ Source/Drain Metallization and Graded–$In_xGa_{1-x}As$ Layers*, authored by N.A. Papanicolaou et al., p. 7 in the IEEE Electron Device Letters, vol. 15, No. 1, Jan. 1994.

*A New Fabrication Technology for AlGaAs/GaAs HEMT LSI's Using InGaAs Nonalloyed Ohmic Contacts*, authored by S. Kuroda et al., p. 2196 in the IEEE Transactions on Electron Devices, vol. 36, No. 10, Oct. 1989.

*A Highly Manufacturable 0.2 μm AlGaAs/InGaAs PHEMT Fabricated Using the Single–Layer Integrated–Metal FET (SLIMFET) Process*, authored by Charles K. Havasy et al., appearing in the IEEE Gallium Arsenide Integrated Circuit Symposium, Conference Proceedings, San Diego CA, Oct. 1995.

FIELD EFFECT TRANSISTOR DEVICE WITH SINGLE LAYER INTEGRATED METAL AND RETAINED SEMICONDUCTOR MASKING

RIGHTS OF THE GOVERNMENT

The invention described herein may be manufactured and used by or for the Government of the United States for all governmental purposes without the payment of any royalty.

CROSS REFERENCE TO RELATED PATENT DOCUMENTS

The present document is somewhat related to the copending and commonly assigned patent application documents "Metal Semiconductor Field-Effect Transistor (MESFET) Device With Single Layer Metal", AFD 00156, Ser. No. 08/684,759; "Single Layer Integrated Metal Process for Metal Semiconductor Field-Effect Transistor (MESFET)", AFD 00157, Ser. No. 08/684,760; "High Electron Mobility Transistor (HEMT) and Pseudomorphic High Electron Mobility Transistor (PHEMT) Devices With Single Layer Integrated Metal" AFD 00158, Ser. No. 08/684,756; "Single Layer Integrated Metal Process for High Electron Mobility Transistor (HEMT) and Pseudomorphic High Electron Mobility Transistor (PHEMT)" AFD 00082, Ser. No. 08/684,761; "Field-Effect Transistor Process With Semiconductor Mask, Single Layer Integrated Metal, and Dual Etch Stops" AFD 00169, Ser. No. 08/684,755; which are all filed of even date herewith. The contents of these related applications are hereby incorporated by reference herein.

BACKGROUND OF THE INVENTION

This invention relates to field-effect transistor structure.

The present invention achieves the goal of a field-effect transistor having single metalization gate contact and source/drain contact elements—a single metalization structure which is practical, economically viable and includes Schottky barrier and ohmic junction characteristics of the gate contact and the source/drain contacts respectively. The invention arises from compromise between several semiconductor device disciplines—including material growth, device metalization, and material deposition disciplines. The achieved field-effect transistor is technically and economically viable for use in analog transistor applications extending to the microwave and millimeter wave spectral regions for example.

Several features appearing in the present invention also appear in the patent and publication literature in the form of stand-alone concepts, concepts used in a different setting or concepts combined in less than the total form contemplated in the present invention. The present invention is therefore believed to represent a novel and unobvious combination of such features to achieve a useful result. Use of the same metal in parts of the source, drain and gate structure of a field-effect transistor for example appears in a certain form in transistors fabricated some years ago when the self aligned gate structure was new in the art. Examples of this same metal usage appear for example in the two related RCA patents of Napoli et al., U.S. Pat. No. 3,764,865 and U.S. Pat. No. 3,861,024. The same metal concept also appears in the two related Westinghouse patents of Kim, U.S. Pat. No. 3,855,690 and U.S. Pat. No. 3,943,622.

In each of these four patents however, the disclosed transistor involves use of a common metal to connect to an already formed source/drain ohmic contact and to form the Schottky barrier gate contact. In the silicon material used in the devices of these four patents an ohmic contact is moreover achieved with the mere addition of another layer of material and does not require the alloying, annealing and other complexities needed for a group III–V semiconductor device ohmic contact. The present invention is believed distinguished over the disclosure of these older transistor patents by its use the same metal to actually form the gate contact as to form the source/drain contacts of the transistor. Moreover in the present invention these source/drain contacts are achieved in a non alloyed processing fashion.

The U.S. Pat. No. 4,961,194 of S. Kuroda et al., describes gallium arsenide MESFET and HEMT devices which use the combination of non-alloyed ohmic contacts, same metal electrodes, acetone solvent removal of photoresist coatings, ion implanted device separation areas, selective etching and etch stopping at the surface of a device layer. Although each of these features may be used in the present invention additional concepts not disclosed in the Kuroda et al. patent are also a part of the present invention and provide significant distinction over the Kuroda et al. disclosure. The Kuroda et al. patent for example does not disclose the use of a permanent secondary mask and passivation material layer nor a gate aperture recess received in a gate window nor the precise and time effective termination of etching operations as is accomplished in applicants' invention. In view of the similar areas of work and in the interest of minimizing the size of the present patent document, the contents of the of S. Kuroda et al. U.S. Pat. No. 4,961,194 patent are hereby incorporated by reference herein.

An article published in the technical literature some years ago is also of interest with respect to the single metal concept and is additionally of interest with respect to the use of non-alloyed ohmic contacts in a field-effect transistor. This article "A New Fabrication Technology for AlGaAs/GaAs HEMT LSI's Using InGaAs Non-alloyed Ohmic Contacts" is also authored by S. Kuroda et al., and appears at page 2196 in the Institute of Electrical and Electronic Engineers Transactions on Electron Devices, Volume 36, number 10, October, 1989. This Kuroda article is in fact of an especially enlightening contrast nature with respect to the present invention since it teaches the use of a complex etching sequence during formation of transistor elements and the present invention avoids use of this sequence in favor of a more practical and less costly procedure.

In a somewhat related situation the technical article "All-Refractory GaAs FET Using Amorphous TiWSi$_x$ Source/Drain Metalization and Graded In$_x$Ga$_{1-x}$As Layers" authored by N. Papanicolaou which appears at page 7 in the Institute of Electrical and Electronic Engineers Electron Devices Letters, volume 15, number 1, January, 1994 discloses the use of non-alloyed ohmic contacts in a gallium arsenide field-effect transistor. The Papanicolaou article however, relates to the fabrication of a high temperature field-effect transistor device, a device having refractory metal elements and involving the use of Tungsten metal. The Papanicolaou article also presents an informative discussion of the non-alloyed ohmic contact art.

The textbook "Modern GaAs Processing Methods" authored by Ralph Williams, Artech House, of Boston and London, is of assistance in explaining and understanding certain aspects attending the present invention including its relationship with the prior art. In the further interest of minimizing the size of the present document, the contents of the of this Ralph Williams, Artech House textbook are therefore hereby incorporated by reference herein.

Non-alloyed ohmic contacts are additionally disclosed in several published technical journal articles as follows.

1. Ohmic Contacts to n-GaAs Using Graded Band Gap Layers of $Ga_{1-x}In_xAs$ Grown by Molecular Beam Epitaxy, authored by J. M. Woodall et al., page 626 in the J. Vacuum. Science. Technology. Vol 19, number 3, September/October 1981.
2. HEMT with Non-alloyed Ohmic Contacts Using $n^+$-InGaAs Cap Layer, authored by S. Kuroda et al., page 389 in the IEEE Electron Device Letters, Volume EDL-8, number 9, September 1987.
3. Extremely Low Non-alloyed and Alloyed Contact Resistance Using an InAs Cap Layer on InGaAs by Molecular-Beam Epitaxy, authored by C. K. Peng et al., and appears at page 429 in the J. Applied. Physics. Volume 64, number 1, Jul. 1, 1988.
4. Non-Alloyed Ohmic Contacts to n-GaAs Using Compositional Graded $In_xGa_{1-x}As$ Layers, authored by T. Nittono et al., pages 1718–1722 in the Japanese Journal of Applied Physics, Volume 27, number 9, September 1988.
5. Extremely Low Contact Resistances for AlGaAs/GaAs Modulation-Doped Field-Effect Transistor Structures, authored by A. Ketterson et al., page 2305 in the J. Applied. Physics. Volume 57, number 6.

Although each of these documents from the prior art may relate to an aspect of the present invention it is believed that the invention as described herein represents the first combination of the plurality of concepts and compromises necessary to achieve a successful single metal, non-alloyed contact, selective etching-achieved, and secondary mask-inclusive field-effect transistor.

SUMMARY OF THE INVENTION

The present invention provides for a field-effect transistor of simplified structure and low cost manufacturing process. The invention adds a structural element, a masking/electrically insulating/passivating layer which is of epitaxial semiconductor material and which is useful in both the fabrication sequence and as an element of the completed transistor.

It is an object of the present invention therefore to provide a field-effect transistor of various types having the combination of a permanent semiconductor material secondary mask element and non alloyed ohmic source and drain contacts.

It is another object of the present invention to provide a simplified and lower cost field-effect transistor apparatus.

It is an object of the invention to provide a field-effect transistor of simplified metal structure.

It is an object of the invention to provide a field-effect transistor which includes periodic table group III–V materials of the gallium arsenide, indium or other types.

It is another object of the present invention to provide a field-effect transistor in which certain lithographic and metal deposition steps for forming a Schottky gate contact element have also formed the transistor drain/source ohmic contact elements.

It is another object of the invention to provide a field-effect transistor improved through the use of indium gallium arsenide cap layer-enabled non-alloyed ohmic contacts of low electrical contact resistance.

It is another object of the invention to provide a field-effect transistor improved through the use of an indium gallium arsenide cap layer and ohmic contacts of low electrical resistance.

It is another object of the invention to provide a field-effect transistor in which a GaAs cap layer is replaced with a cap layer of graded composition.

It is another object of the invention to provide a field-effect transistor in which a permanent secondary mask element is used.

It is another object of the invention to provide a field-effect transistor in which a secondary mask element enables use of non-alloyed ohmic contacts.

It is another object of the invention to provide a field-effect transistor arrangement which is relatively insensitive to process-induced variations and therefore provides material growth characterization capability.

It is another object of the invention to provide a field-effect transistor which provides consistent low resistance electrical contacts.

It is another object of the invention to provide a field-effect transistor in which electrical contact alloying problems and resulting contact variability are avoided.

It is another object of the invention to provide a field-effect transistor which avoids a critical alignment step through use of common ohmic contacts and gate region metalizations.

Additional objects and features of the invention will be understood from the following description and claims and the accompanying drawings.

These and other objects of the invention are achieved by a single metal contact structure for a group III–V semiconductor material field-effect transistor comprising the combination of::

a lowermost-situated group III–V semiconductor material substrate layer member;

a plurality of grown group III–V semiconductor material layers successively overlaying said substrate layer member, said grown semiconductor material layers including an uppermost selected one of a field-effect transistor channel layer and a barrier layer-covered field-effect transistor channel layer;

a first etch stop layer received over said selected layer;

a gate contact member of first metallic composition received on said selected layer in a gate aperture region of said first etch stop layer, said gate contact member having Schottky barrier electrical characteristics with respect to said selected one of a field-effect transistor channel layer and a barrier layer-covered field-effect transistor channel layer;

a layer of ohmic contact semiconductor material overlaying said first etch stop layer-covered selected layer in regions adjacent said gate member;

a second etch stop layer received over said layer of ohmic contact semiconductor material in regions adjacent said gate member;

a secondary mask layer overlaying said layer of ohmic contact semiconductor material in regions surrounding said gate aperture region and said source and drain members, said secondary mask layer also being comprised of group III–V semiconductor material;

source and drain contact members of said same first metallic composition received on said ohmic contact semiconductor material layer in aligned source and drain apertures through said secondary mask layer and said second etch stop layer in laterally opposed locations with respect to said gate aperture region, said source and drain contact members having non-alloyed ohmic contact electrical characteristics with respect to said semiconductor material of said ohmic contact layer.

DETAILED DESCRIPTION

Figure 1A:
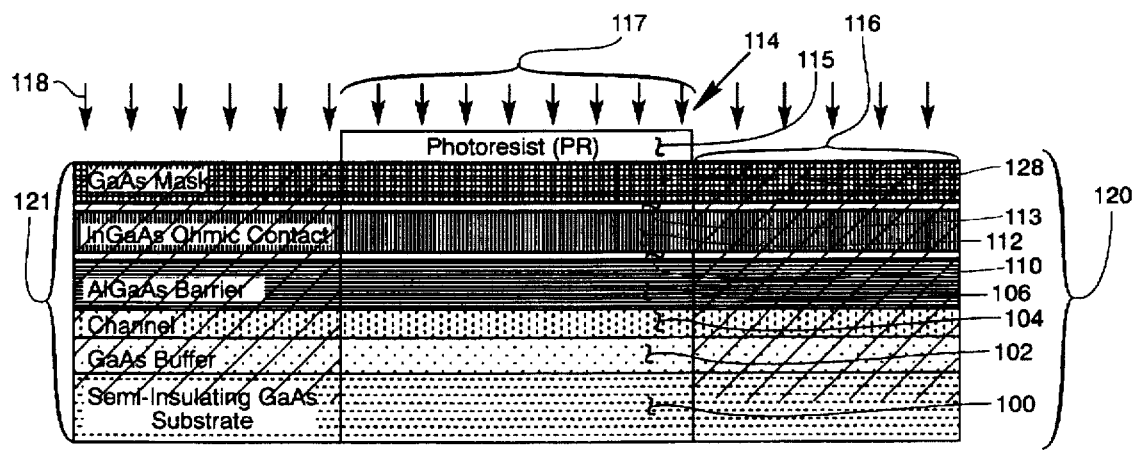
FIG. 1a shows an initial wafer structure usable to achieve a field-effect transistor.
Figure 1B:
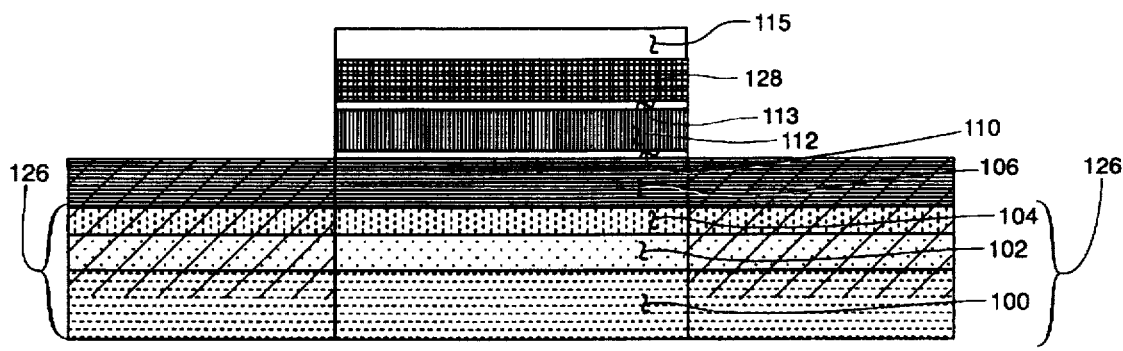
FIG. 1b shows the FIG. 1a structure after an additional processing step.

The several views of FIG. 1a through FIG. 1l, views which are herein collectively referred-to as FIG. 1 in the drawings, show a desirable different arrangement of the SLIMFET invention described in the above-identified copending patent documents, an arrangement in which the described silicon nitride secondary mask layer is replaced by a semiconductor material secondary mask layer. This semiconductor material secondary mask layer has the advantage of being a layer which can be grown epitaxially at low cost during the same sequence used to form other semiconductor layers in the device. Use of a semiconductor material in lieu of the silicon nitride material in the mask of layer 128 offers additional advantages in the nature of a more uniform epitaxially formed secondary mask layer, faster starting wafer fabrication times and thereby lower wafer cost, freedom from the pinholes commonly encountered in silicon nitride and similar materials and provides desirable uniform electrical and physical characteristics in the completed field-effect transistor. In addition to these advantages a cost/benefit consideration of the present semiconductor material secondary mask arrangement of the SLIMFET invention should consider however that the herein described transistor is somewhat more difficult to process—in the sense that the etchants used on certain of the other layers of the transistor also react with the herein described semiconductor mask layer material to various degrees and thereby impose a requirement for closer etch control in certain etching steps.

In the FIG. 1 drawing the plurality of views identified as FIG. 1a through FIG. 1l are used to describe the semiconductor layer secondary mask arrangement of the invention. The processing steps of these views presume the semiconductor layers which underlay the secondary mask layer have been previously formed as is discussed briefly in the "Single Layer Integrated Metal Process for High Electron Mobility Transistor (HEMT) and Pseudomorphic High Electron Mobility Transistor (PHEMT)" AFD 00082, Ser. No. 08/684,756 copending patent document. It is significant however, that the transistor related semiconductor layers in the present embodiment of the invention differ significantly from those used in the 08/684,756 copending patent document.

Fabrication of a field-effect transistor device according to the present invention may start with a wafer having each of the semiconductor layers represented in FIG. 1a previously formed or alternately may start with some intermediate status of a wafer such as a wafer having only the substrate 100, the buffer layer 102 and the channel layer 104 previously formed for example. Wafers having all of the layers represented in FIG. 1a may be obtained to specification, e.g., the Table 1a specification below, or as standard products from several suppliers to the integrated circuit art. Wafers having some intermediate number of predisposed layers will also be available from such sources. Selection from these starting point options is therefore primarily a matter of available fabrication resources and economic considerations. The FIG. 1a layer structure of course indicates that the transistor to be fabricated using the indicated sequence is either a high electron mobility transistor or a pseudomorphic high electron mobility transistor version of the field-effect transistor; alternate starting wafer arrangements accoiated with other transistor types are shown in the drawings of the above-identified copending and incorporated by reference additional patent documents.

In the FIG. 1a view of a wafer segment, a field-effect transistor channel layer 104 is shown to be received on a buffer layer 102 which is supported by a substrate 100. This channel layer is in turn covered by a barrier layer 106, a thin but permanent etch stop layer 110 and an ohmic contact layer 112. The ohmic contact layer 112 is in turn covered by a second thin but permanent etch stop layer 113 and then by the semiconductor secondary mask layer 128. These semiconductor layers of the FIG. 1a wafer 114 may be comprised of the materials indicated in the FIG. 1a drawing and may have the thickness, doping levels and other characteristics indicated in Table 1a below.

TABLE 1a

| Line No. | Purpose | Material Mole Fraction | Doping Concentration ($cm^{-3}$) | Superlattice Repetition | Layer Thickness | Total Thickness | FIG. 3a Reference |
|---|---|---|---|---|---|---|---|
| 1. | In lieu of $Si_3N_4$ 2nd M | GaAs | undoped ×10 $cm^{-3}$ | 1X | 200 Å | 200 Å | 128 |
| 2. | Etch Stop | AlAs | n-type Si $1 \times 10^{19}\ cm^{-3}$ | 1X | 50 Å | 250 Å | 113 |
| 3. | Ohmic Contact | InAs | n-type Si $5 \times 10^{19}\ cm^{-3}$ | 1X | 140 Å | 390 Å | 112 |
| 4. | Ohmic Contact | GaAs | n-type Si $6 \times 10^{18}\ cm^{-3}$ | Begin 10X | 11.3 Å | 503 Å | 112 |
| 5. | Ohmic Contact | InAs | n-type Si $5 \times 10^{19}\ cm^{-3}$ | End 10X | 15.2 Å | 655 Å | 112 |

TABLE 1a-continued

| Line No. | Purpose | Material Mole Fraction | Doping Concentration ($cm^{-3}$) | Superlattice Repetition | Layer Thickness | Total Thickness | FIG. 3a Reference |
|---|---|---|---|---|---|---|---|
| 6. | Ohmic Contact | GaAs | n-type Si $6 \times 10^{18}$ $cm^{-3}$ | 1X | 50 Å | 705 Å | 112 |
| 7. | Etch Stop | AlAs | n-type Si $1 \times 10^{19}$ $cm^{-3}$ | 1X | 30 Å | 805 Å | 110 |
| 8. | Barrier Layer | AlGaAs X = 0.20 | undoped x10 $cm^{-3}$ | 1X | 250 Å | 1055 Å | 106 |
| 9. | Delta Doped | | n-type Si $5 \times 10^{12}$ $cm^{-3}$ | X | 0 Å | 1055 Å | 106 |
| 10. | Spacer Layer | AlGaAs | undoped x10 $cm^{-3}$ | 1X | 40 Å | 1095 Å | 106 |
| 11. | FET Channel | InGaAs X = 0.15 | undoped x10 $cm^{-3}$ | 1X | 130 Å | 1225 Å | 104 |
| 12. | Buffer | GaAs | undoped x10 $cm^{-3}$ | 1X | 4000 Å | 5225 Å | 102 |
| 13. | Buffer | GaAs | undoped x10 $cm^{-3}$ | Begin 12X | 30 Å | 5585 Å | 102 |
| 14. | Buffer | AlGaAs X = 0.20 | undoped x10 $cm^{-3}$ | End 12X | 150 Å | 7385 Å | 102 |
| 15. | Buffer | GaAs | undoped x10 $cm^{-3}$ | 1X | 500 Å | 7885 Å | 102 |
| 16. | Substrate | GaAs | semi-insulating x10 $cm^{-3}$ | X | Å | 7885 Å | 102 |

As may be already apparent to persons person skilled in the gallium arsenide field-effect transistor art and also apparent from a brief consideration of the several layers represented in the lines of Table 1a, certain additional routine or standard layers in addition to those shown in FIG. 1a are often used in the fabrication of a HEMT or pHEMT device. These additional layers may include for example a graded layer located intermediate the barrier layer 106 and the etch stop layer 110. Such a graded layer is helpful in enabling charge carriers to transition from the lightly doped semiconductor material of the barrier layer 106 to the very heavily doped semiconductor material of the ohmic contact layer 112 during completed transistor operation for example.

The spacer layers indicated between the channel layer 104 and barrier layer 106 are another example of these standard layers. Such spacer layers are used to physically separate the channel layer from the supply layer to reduce scattering. Since the physical and fabrication nature of the graded and spacer layers, and additional other routine or standard layers which may be used in a HEMT or pHEMT device, is dependent on process related considerations i.e., on the equipment and step variations which are used by each wafer supplier, such routine or standard layers are omitted in the FIG. 1 drawing.

Notwithstanding this FIG. 1 expediency, Table 1a above indicates the identity and characteristic of each actually-processed semiconductor layer including layer gradations which have been found convenient in a starting-point wafer using the processing equipment and expertise available to the present inventors. In Table 1a the layers indicated at line numbers 1 and 2 relate especially to the semiconductor secondary mask layer of the present invention and represent a point of significant difference between the present invention and the invention of the "Single Layer Integrated Metal Process for High Electron Mobility Transistor (HEMT) and Pseudomorphic High Electron Mobility Transistor (PHEMT)" related and copending patent document.

In Table 1a the layers indicated at line numbers 3, 4, 5 and 6 comprise the grading which may be used in forming the ohmic contact layer 112 even though several of these layers are not expressly shown in the FIG. 1 drawings. These differences relating to the ohmic contact layer suggest the FIG. 1 drawing and the descriptions relating thereto in this document may therefore be viewed as showing the essential steps and the essential layers in a present invention fabrication sequence. the The actual processing used to obtain these layers in applicants' embodiment of the invention may be additionally understood by a simultaneous consideration of FIG. 1 and Table 1a.

In a related manner the recitation of routine or standard layers in the claims of this document is considered to be an undue limitation of the scope of these claims, especially in instances wherein an alternate arrangement transistor—a transistor including alternate routine or standard layer structure, could be asserted to avoid claims reciting different or no standard layers. Several of the claims appended to the present disclosure therefore also omit routine or standard layer language and are couched in terms of what is deemed to be essential steps and essential layers language.

Before departing from the subject of Table 1a it appears worthy of note that the information in this table represents a specification for fabrication of the FIG. 1a starting point structure using certain processing equipment and expertise. The layers recited in this Table 1a data, including the herein new secondary mask layer and second etch stop layers of lines 1 and 2 in Table 1a may all be formed by molecular beam epitaxy (MBE) or metal organic chemical vapor deposition, MOCVD, for example and are of a single crystal nature. Table 1a by reason of this single crystal or epitaxial relationship does not include certain later occurring additional structure such as photoresist masking layers, metalization layers or ion implant-achieved regions in its contents; these additions are of course not of a single crystal nature. Such additional structure is described below in connection with the FIG. 1 sequence of steps. Notably Table 1a does include the secondary mask layer of line 1 since this layer is herein a semiconductor layer and may also have a single crystal relationship with the underlying transistor semiconductor layers.

Although the purpose of the layer achieved from each step in Table 1a i.e., the contribution to transistor function which results from each step of this table will be apparent from the already presented discussion and to those skilled in the transistor fabrication art, the following brief description of these layer to function relationships may also be helpful. The cover layer of line 1 in Table 1a is used to fabricate the secondary mask element. The etch stop layer of line 2 in Table 1a is for example used to protect the underlying gallium arsenide of the ohmic layer from removal or attack during removal of the ohmic contact layer 112. The first etch stop layer 110 of line 7 in Table 1a is also used to protect the underlying gallium arsenide of the ohmic layer from removal or attack during removal of the ohmic contact layer 112. The barrier layer of line 8 acts to confine charge carriers to the channel layer 104 of the FIG. 1 transistor. The delta doped layer of line 9 in Table 1a serves to provide carriers in the completed FIG. 1 transistor.

The spacer layer of line 10 in Table 1a serves to reduce carrier scattering. The channel layer of line 11 in Table 1a is the location of charge carrier flow between source and drain of the FIG. 1 transistor. The buffer layer 102 of FIG. 1 and lines 12–15 in Table 1a serves as a crystallographic interface between the lattice structure of the substrate member 100 and the differing lattice structure of the channel layer 104. To accomplish this interface however, it is desirable to use a multiple layer superlattice fabrication sequence as shown in lines 12–15 of Table 1a. In this structure the four layers accomplish a smooth, dislocation-free starting point for subsequent high quality crystal growth. The single crystal or epitaxial layers on the wafer 114 can actually be accomplished using either molecular beam epitaxy (MBE), metal organic chemical vapor deposition (MOCVD) or possibly other growth techniques. The invention uses highly doped InGaAs layers or other low energy bandgap material compatible with the underlying FET layers as the cap layer or ohmic contact layer 112 to form non-alloyed ohmic contacts using known Schottky refractory metalization procedures.

The FIG. 1 drawings show the incorporation of etch stop layer 110 and etch stop layer 113 into the wafer 114 structure-in order to provide non photoresponsive, permanence and temperature immunity characteristics into the mask structures. These layers are fabricated from semiconductor materials which can be selectively removed from specific areas of the structure without harm to adjacent portions of the transistor during later portion of the fabrication sequence and may have thickness dimensions of thirty and fifty angstroms as shown in table 1a or generally thickness dimensions up to seventy angstroms. The secondary mask layer 128 for example serves as a combination of a masking material for a mask used in a subsequent fabrication step, as a selectively removable masking material which is non responsive to photoresist mask removal materials, as a heat tolerant electrical insulator on which metallic conducting material can be deposited and as a permanent covering layer which is not detrimental to performance in the completed transistor. Since a major part of this secondary mask layer 128 remains in the finished transistor, it also provides some degree of passivation and protection of the completed transistor's exposed surface (i.e., the non-metal covered surface portions) from contamination and physical damage. For present discussion purposes the masking one of these layer 128 functions is of primary interest. Indeed without the masking capabilities arising from this secondary mask layer 128, and especially the later described benefits of such a mask in precluding another critical mask realignment operation, the benefits of the present invention could not be achieved.

The layer 128 herein may be referred-to as a secondary mask or consumable secondary mask layer, such references being in relation to its function in the fabrication sequence of protecting the field-effect transistor ohmic layer during gate window recess etching. Notably in the presently described embodiment of the invention the secondary mask layer 128 is included in the Table 1a described layers of the transistor; this is of course in keeping with the fact that this layer in the present arrangement of the invention lends to both MBE and MOCVD fabrication and to single crystal relationships with the underlying FIG. 1 layers. The consumable aspect of the present secondary mask layer 128 relates of course to its etch-consumed nature in gate source and drain portions of the device structure for example. Portions of the mask layer 128 underlying other parts of the FIG. 1 device remain permanently with the fabricated device notwithstanding this consumable nature and it is therefore referred-to simply as the secondary mask layer in the present document.

Continuing with a discussion of the other drawings in the FIG. 1 series, an ion implantation isolation of adjacent transistors on a wafer, an implantation as represented at 118 in FIG. 1a, may be used to achieve adjacent transistor electrical isolation in the layers below secondary mask layer 128. Such implanting, with oxygen ions for example, is preferably accomplished through use of the single dual use mask indicated at 115 in FIGS. 1a and 1b—in order to avoid a tedious and error prone mask realignment step if two masks and a two step sequence were used. The achieved implanting is represented by the shading shown at 122 in the FIG. 1 drawings. FIG. 1a in the drawings therefore shows the addition of the lithographically configured photoresist mask 115 over the secondary mask layer 128 of FIG. 1a. This dual use mask 115 may be made of the photoresist material PGMI/1813 made by MCC and Shipley of Newton Mass. and Marlborough, Mass. respectively. The multiple-layered isolation regions achieved by such ion implantation are shown at 120 and 121 in FIG. 1a.

By way of additional explanation, since the InGaAs of the ohmic contact layer 112 and to some extent the secondary mask layer 128 once formed in its heavily doped and electrically conducting condition is not easily made electrically non-conducting, an actual removal of this material in the isolation regions between adjacent transistors of a wafer is desirable. Several techniques for etching this ohmic contact layer 112 material away are available. Standard photolithography processes which define the desired transistor active region 117 by way of the mask 115 and enable a selective mesa isolation wet etch in the non active heavily doped regions 116 can for example be used.

Figure 1C:
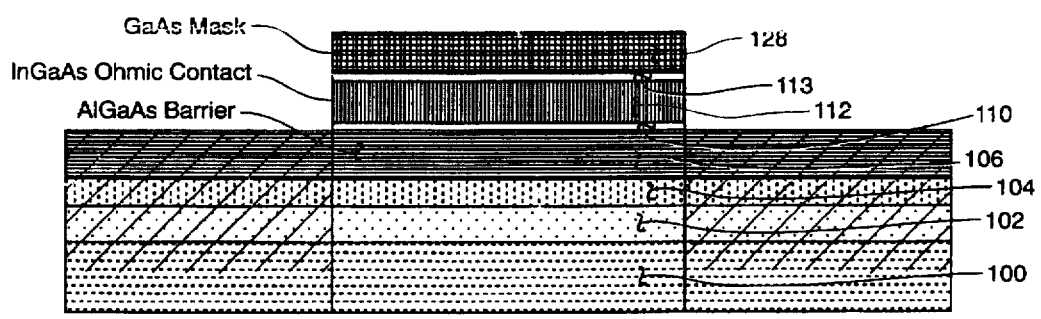
FIG. 1c shows the FIG. 1b structure after an additional processing step.

Accomplished removal of the ohmic contact layer 112, etch stop layers 110 and 113, and secondary mask layer 128 material is indicated in FIG. 1c. The appearance of the ion implanted regions 120 and 121 after removal of implant region portions of the ohmic contact layer 112 is shown at 124 and 126 in FIG. 1b. The photoresist mask 115 has also been removed in the FIG. 1c drawing.

Figure 1D:
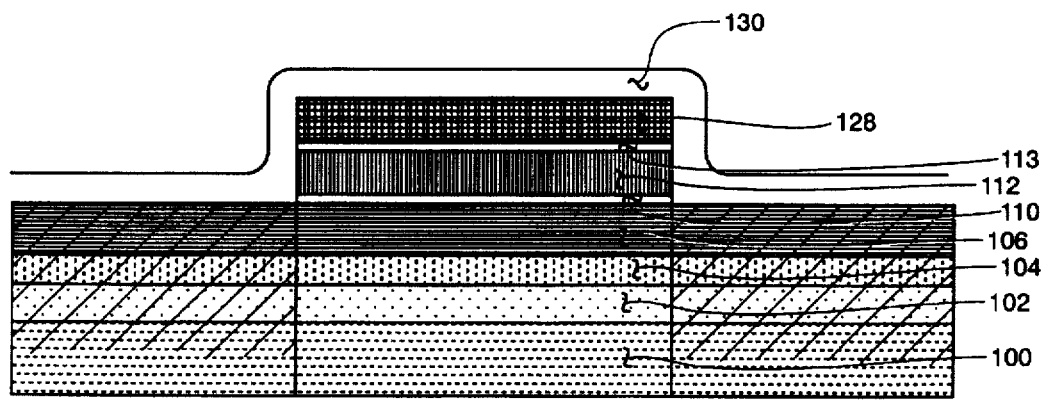
FIG. 1d shows the FIG. 1c structure after an additional processing step.
Figure 1E:
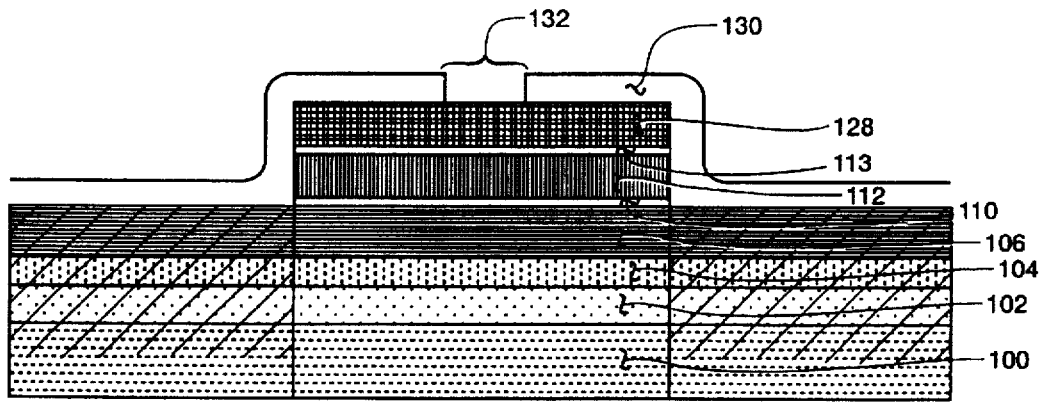
FIG. 1e shows the FIG. 1d structure after an additional processing step.
Figure 1F:
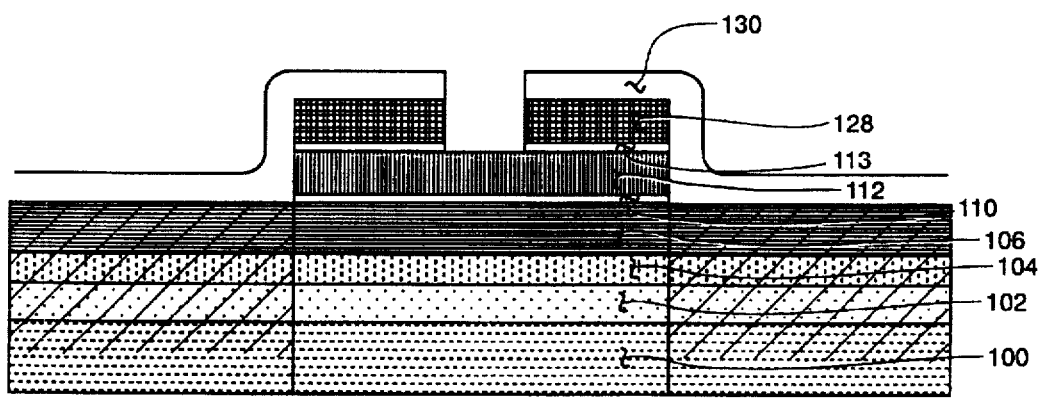
FIG. 1f shows the FIG. 1e structure after an additional processing step.

FIG. 1d of the drawings shows a photoresist mask layer 130 to be added to the FIG. 1c structure. This photoresist mask layer 130 may be made of the Shipley photoresist material 1813. A gate recess aperture or gate window opening 132 has been formed photolithographically in this photoresist mask layer 130 in FIG. 1e. The recess aperture 132 of course provides access to the secondary mask layer 128 in order that it can be removed from the gate window area during a subsequent etching. FIG. 1f represents such removal of the secondary mask layer 128 material in the recess aperture 132 to leave the desired gate window recess in the secondary mask layer 128 and accomplish exposure of the ohmic contact layer 112 material. A citric acid based etch solution is used to remove the secondary mask layer 128 in the recess aperture 132.

Figure 1G:
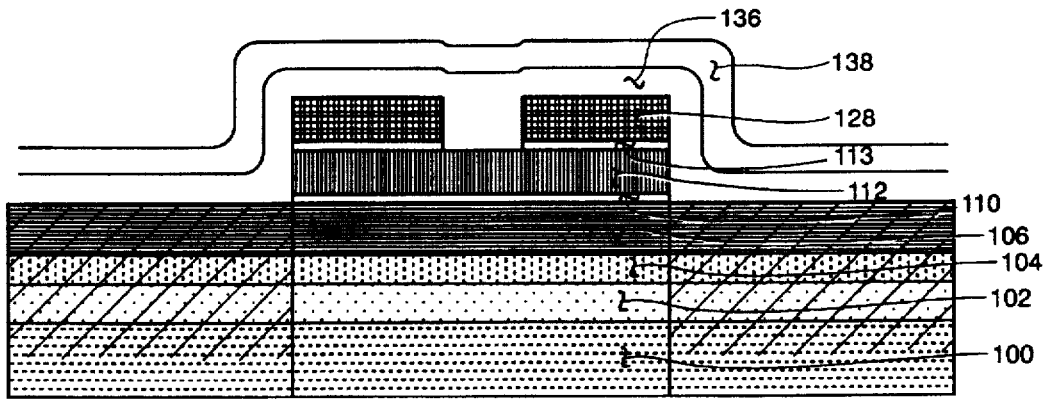
FIG. 1g shows the FIG. 1f structure after an additional processing step.

Next in what may be described as a large feature or optical lithography gate region arrangement of the invention the photoresist layer 130 is removed and two new and differing layers 136 and 138 of photoresist are applied as shown in the FIG. 1g drawing. The two photoresist materials used in the FIG. 1g step provide sensitivity and mutual exclusivity for two differing spectral ranges of exposure energy in the ultraviolet range as is described below herein. A photoresist material such as the PMGI type which includes a polymethylmethacrylate component is suitable for the lowermost layer 136 of this photoresist. Suitable PMGI photoresist is available from Microlithography Chemical Corporation of Newton, Mass. A photoresist material such as the Shippley type 1813 is suitable for the upper resist layer 138 in FIG. 1g. The PGMI photoresist of layer 136 is of course applied first to the FIG. 1h structure. A large feature arrangement of the invention using these photoresist materials is generally considered to mean a transistor having a gate region in which the smallest defined feature or the smallest desired dimension is of at least six tenths of a micron in size. An electron beam exposure-based accomplishment of the invention for gate region dimensions smaller than this six tenths of a micron is described in the Ser. No. 08/684,761 Single Layer Integrated Metal Process for High Electron Mobility Transistor (HEMT) and Pseudomorphic High Electron Mobility Transistor (PHEMT) copending patent document which is incorporated by reference herein and is considered to represent an alternate arrangement of the present invention.

Figure 1H:
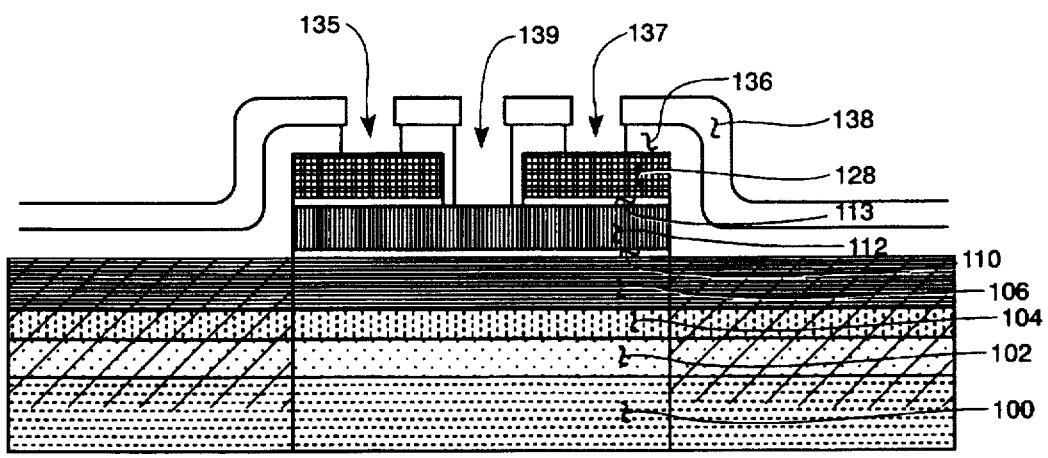
FIG. 1h shows the FIG. 1g structure after an additional processing step.

The formation of photolithographically defined source contact, and drain contact, apertures 135 and 137 (respectively for example) in the photoresist layers 136 and 138 is indicated in FIG. 1h of the drawings. Formation of the gate aperture 139 also is represented in this drawing. In addition to these source, drain and gate contact apertures, the FIG. 1h step may also define gate feed, and contact pad areas of the transistor. Notably the gate geometry definition in the FIG. 1h step is accomplished on the ohmic contact layer 112 while the source and drain definitions occur on the secondary mask layer 128. It is also notable that the developing and removal of mask aperture areas represented in FIG. 1h have been used to accomplish the upper mask overhang, lip or cliff region indicated at 141 commencing in FIG. 1h. This overhang region assures the presence of subsequently deposited metal discontinuities which are useful during a later metal removal step (i.e., a metal lift-off step) of the fabrication process. These metal discontinuities enable segregating or separating desired gate source and drain contact metal from undesired excess metal inherently deposited on the upper surface of the transistor. A double exposure sequence involving two differing ultraviolet light spectral ranges as described in connection with the EBOL processing sequence in the copending Ser. No. 08/684,761 "Single Layer Integrated Metal Process for High Electron Mobility Transistor (HEMT) and Pseudomorphic High Electron Mobility Transistor (PHEMT)" patent document is used in defining the apertures 135, 137 and 139 in FIG. 1h. As is known in the lithography art an over development of the image in the photoresist layer 136 may be used to achieve the lip or overhang or cliff region 141.

Figure 1I:
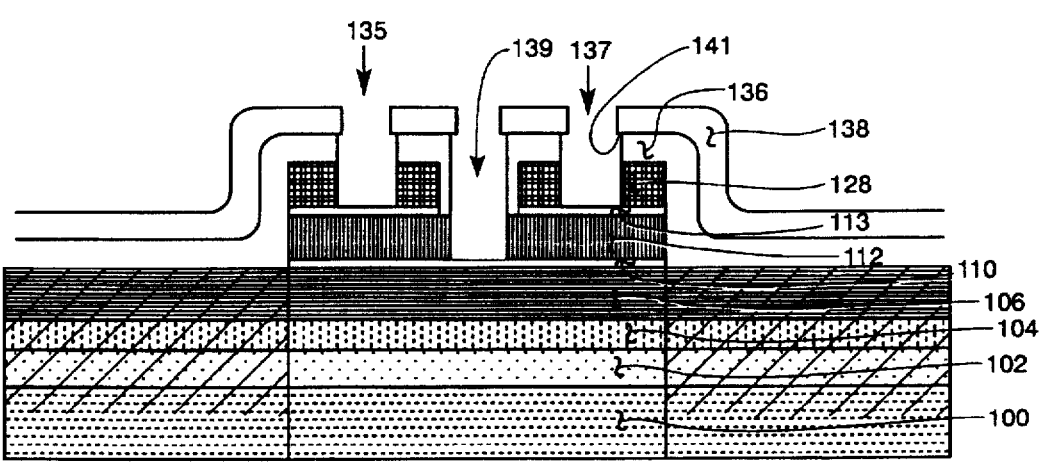
FIG. 1i shows the FIG. 1h structure after an additional processing step.

The ensuing FIG. 1i step represents the definition of gate geometry, i.e., the gate length and gate width dimensions of the transistor within the aperture 139. (Gate "length" here is presumed, according to convention, to extend in the direction of charge carrier flow or from side to side in the FIG. 1i drawing.). In the FIG. 1i drawing use of a selective etch to remove a gate contact-sized aperture in the ohmic contact layer 112 within the gate aperture 139 is represented. Complete removal of the ohmic contact layer 112 down to the etch stop layer 110 within the gate aperture 139 is desired since the subsequently received gate metal should be formed on the barrier layer 106 underlying this etch stop layer 110 and the ohmic contact layer 112. A selective etch for the indicated indium gallium arsenide material of this ohmic contact layer 112 may be accomplished using the citric acid/hydrogen peroxide etch process described in the Ser. No. 08/684,761 "Single Layer Integrated Metal Process for High Electron Mobility Transistor (HEMT) and Pseudomorphic High Electron Mobility Transistor (PHEMT)" patent document and in the four published papers of G. C. DeSalvo, G. C. DeSalvo, R. D. Remba et al. and J. K. Abrokwah described therein. A timed selective etch is preferred for the aperture 139 ohmic material removal step indicated in FIG. 1i; both wet and dry etching is possible.

It is notable that during this FIG. 1h to FIG. 1i gate window sized aperture etch of the ohmic contact layer 112 within the gate aperture 139, a removal of the semiconductor secondary mask layer 128 in the apertures 135 and 137 is also occurring simultaneously. This removal, a removal accomplished by the same citric acid and hydrogen peroxide etchant, extends down to the etch stop layer 113. This simultaneous etching in two different locations of the FIG. 1i structure requires selection of a somewhat precise ratio of hydrogen peroxide and citric acid etchant volumes in order to reach concurrent termination points in the two different etching locations—concurrent terminations notwithstanding the different material thickness which may be present. It is notable however that a significant degree of criticality is removed from this simultaneous etching in different locations by the presence of the etch stop layer 110 and etch stop layer 113 which serve to terminate the etching in the vertical direction of FIG. 1i in each of the three apertures 135, 137 and 139. This vertical termination however, does not stop etching in the horizontal directions of the FIG. 1i materials in ohmic contact layer 112 and secondary mask layer 128. Hence the determination of proper hydrogen peroxide to citric acid etchant volume ratios is important in order to reach concurrent termination points. Generally an etchant composed of twenty parts citric acid and one part hydrogen peroxide may be used however, in such large ratio mixtures the citric acid concentration becomes somewhat variable and may extend to fifty parts for example.

By way of additional explanation, the etch stop layer 113 is found desirable in the present arrangement of the invention because of the characteristics of available semiconductor material etchants. More precisely, the buffered-oxide etchant described in the silicon nitride secondary mask versions of the present invention copending patent documents is capable of removing the material of a silicon nitride secondary mask layer and of stopping its etching action when the underlying InGaAs of an ohmic contact layer is reached. Because of this discrimination ability, an etch stop layer 113 may be avoided in the silicon nitride secondary mask arrangements of the invention. In the case of a semiconductor material secondary mask member, as contemplated herein however, this clear segregation of etchant responses is not available and the etchant used to remove the semiconductor material of the secondary mask layer 128 will react significantly with the InGaAs of the next adjacent semiconductor layer, the ohmic contact layer 112. In order to prevent or limit this undesired reaction the additional etch stop layer 113 is desirable in the present arrangement of the invention.

The simultaneous etching in the apertures 135/137 and aperture 139 in FIG. 1i enables a better understanding of the importance of the secondary mask layer 128 in achieving a transistor according to the present invention. Without the separate but jointly present in FIG. 1i masks of layers 128 and 136 for the apertures 135/137 and aperture 139, a delicate mask realignment step and separate distinct metalization operations for these regions would be required—as is the present state of the field-effect transistor fabrication art. (It is particularly notable, for example, that the process of the above identified U.S. Pat. No. 4,961,194 of S. Kuroda et al., does not include the secondary mask layer 128 and does therefore contemplate separate metalization steps). In addition to enabling a single common metalization step, the absence of a realignment step is particularly desirable in the gate region of a field-effect transistor since accurate gate placement is needed to obtain optimum performance from a fabricated device.

Figure 1J:
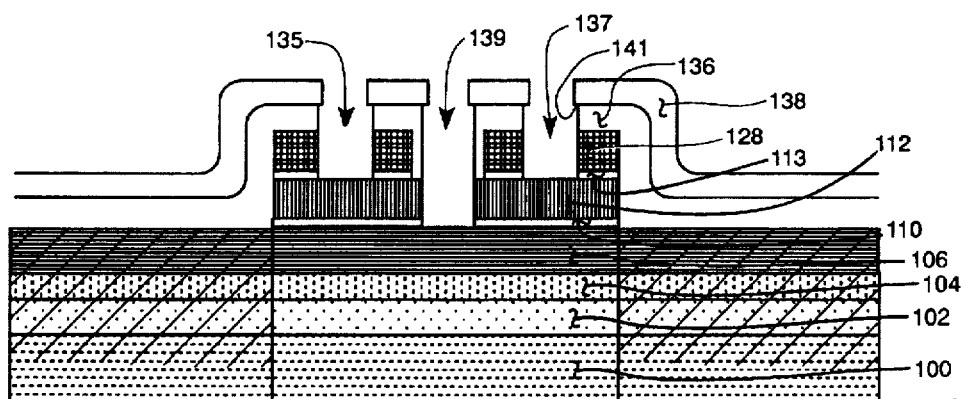
FIG. 1j shows the FIG. 1i structure after an additional processing step.

FIG. 1j shows accomplishment of a wet chemical etching of the etch stop layer 110 and etch stop layer 113 to expose the ohmic contact layer 112 material in the source and drain regions in the transistor and the barrier layer 106 in the gate region of the transistor. An etchant such as hydrochloric acid and water in a volumetric rato between 1 part acid to one part water and one part acid to ten parts water may be used for these FIG. 1j joint source/drain and gate etches. Other known in the art etchants including sulfuric acid and ammonium hydroxide may also be used. The PMMA photoresist materials are relatively inert to this etch but would be affected by the hydrofluoric acid of a buffered oxide etch. This FIG. 1j etch step represents a selective removal of the Aluminum Arsenide of the two stop etch layers 110 and 113 through the expediency of having included the secondary mask layer 128 in the FIG. 1 device and without use of a two step lithographic process.

Figure 1K:
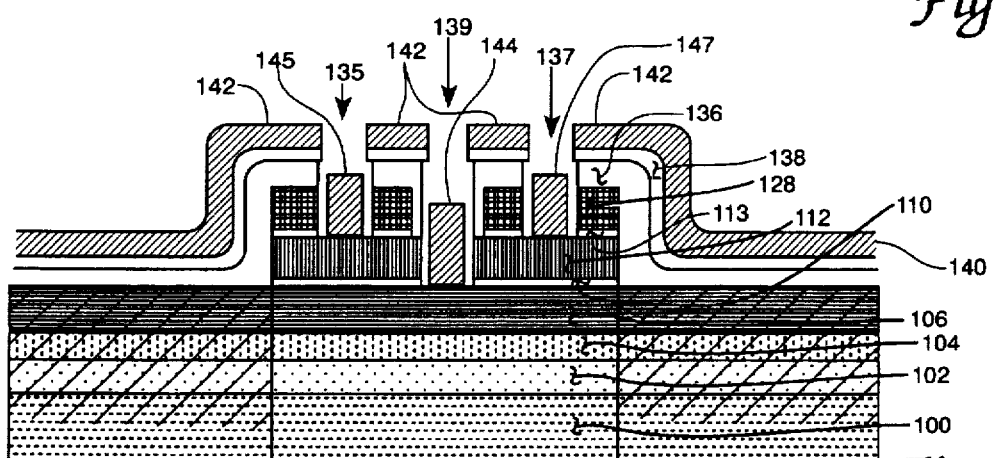
FIG. 1k shows the FIG. 1j structure after an additional processing step.

With the source/drain and gate regions of the device exposed as in FIG. 1j, a single deposition of metal as represented at 140 in FIG. 1k can be accomplished. A metal scheme of Titanium, Platinum, and Gold in the respective thicknesses of 200:500:5300 angstroms has been found desirable for this purpose. Other metal combinations including Titanium and Gold with a total thickness of 6000 Angstroms may also be used in this step. Any metal that forms both a Schottky contact to the gallium arsenide, or other selected group III-V gate region semiconductor material, and an ohmic contact to highly doped ohmic contact layer versions of this semiconductor material and can be deposited by evaporation can be used in the present metalization step—as long as the metal also does not degrade the remaining photoresist materials during deposition. This metalization step forms the gate contact 144 in the aperture 139, the source/drain contact 145 in the aperture 135 and the source/drain contact 147 in the aperture 137 in FIG. 1k and also deposits metal layer 140 at 142 over the top surface of the FIG. 1k structure, i.e., over the photoresist layer 138. The achieved gate contact 144 may have a length dimension in the charge carrier-traversed direction of between one tenth and ten microns.

This metalization step may also be used to form the interconnecting conductors of the transistor including the gate feed and pad regions. For such interconnecting conductor formation it is necessary to have previously removed the photoresist layers 136 and 138 at the desired interconnect regions since a metal lift-off step is used subsequently to remove any metal supported only by such photoresist mask material. Since the same photoresist pattern is used both as the gate recess etch mask and as the present gate metal definition mask, the gate metal of the FIG. 1k step will be self-aligned to the etched gate recess region on the FET channel.

By way of the differing semiconductor materials and doping concentrations present in the source/drain and gate regions of the device, i.e., present below the FIG. 1k metalizations, the desired ohmic contact electrical characteristics are obtained at the source/drain contact regions and a Schottky barrier electrical characteristic is obtained at the gate contact region with this single metalization step (underlined for emphasis). Since the same photoresist pattern is used both as the gate recess etch mask in FIG. 1i and FIG. 1j and as the gate metal definition mask in the FIG. 1k step, the gate metal is self-aligned to the etched gate recess region on the transistor channel—as is also desired for achieving the optimum alignment which enables best transistor yield and performance.

Figure 1L:
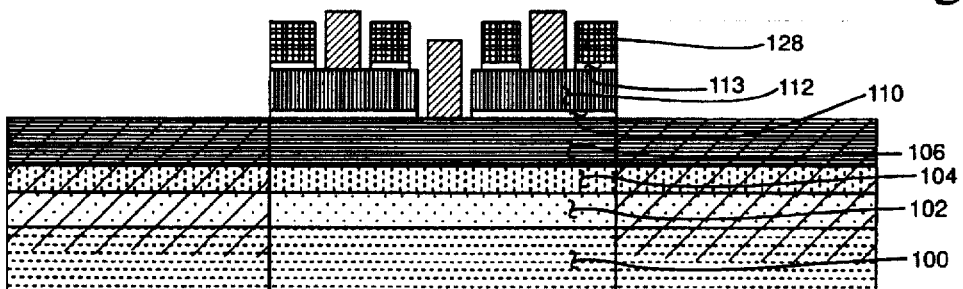
FIG. 1l shows the FIG. 1k structure after an additional processing step.

Removal of the photoresist layers 136 and 138 is represented in the FIG. 1l drawing. This removal accomplishes a metal lift-off separation of undesired metal from desired metal by way of the lip or overhang or cliff region 141 areas described previously. The device achieved after this metal lift-off includes non-alloyed contacts in the source/drain and gate regions. Following such metal lift-off the FIG. 1 device is complete and ready for known device incorporation procedures. It is notable that portions of the secondary mask layer 128 and the etch stop layer 113 as well as the etch stop layer 110 remain in the completed device of FIG. 1k. The secondary mask layer 128 is especially useful in this remaining behind role since it is not functionally active in operating the completed transistor and thereby can provide with impunity a degree of passivation and protection for the underlying layers which are functionally active.

Table 1b below provides a comparison between the steps used in a conventional field-effect transistor fabrication process and the process of the present invention. Although a "first blush" review of this comparison table may suggest the present invention steps are almost as numerous as those of the previous process a detailed consideration of the data in this table reveals that several of the present invention steps can be accomplished more quickly—by a considerable margin, than is possible in the more conventional process.

TABLE 1b

| SLIMFET Process | Standard FET Process |
| --- | --- |
| Four Lithography Steps: | Five Lithography Steps: |
| Mask Alignment | Mask Alignment |
| Device Isolation | Device Isolation |
| Gate Window | Ohmic Metal |
| Ohmic/Gate Feed/Pad/Gate Metal | Gate Feed & Contact Pad Metal |
|  | Gate Metal |
| Two Metal Dep. & | Four Metal Dep. & |
| Metal Lift-Off Steps Mask | Metal Lift-Off Steps Mask |
| Alignment Marks (Ti/Au) | Alignment Marks (Ti/Au) |
| Ohmic/Contact Pads/Gate (Ti/Au) | Ohmic Contacts (AuGe/Ni) |
|  | Gate Feed & Contact Pads (Ti/Au) |
|  | Gate Contacts (Ti/Au) |
| No Metal Alloys | One Metal Alloy |
| Three Selective Etch Steps | One Selective Etch Stet |
| Gate Window | Gate Recess |
| Gate Recess |  |
| Secondary Mask Removal for Ohmic Contacts |  |

In particular the elimination of steps involving metalization and its attending lithography from the SLIMFET process represent notable time and cost savings. The hours of time involved in accomplishing an accurate mask alignment, the time to evacuate a metalization chamber, the time to accomplish the metalization, and then the time to relieve the vacuum at a controlled rate typically combine to limit fabrication throughput when multiple metalizations are involved for a device. Many etching steps in comparison are of significantly lower cost than a metalization step and therefore are of less significance in device fabrication time and bottom line cost. In considering the table 1b comparison of the present SLIMFET process with a conventional process therefore these second blush detailed factors also merit consideration.

By way of additional comparisons relating to the present invention, it is recognized that conventional transistors of the type described herein make use of the well known gold germanium nickel ohmic contacts and thereby achieve what is considered to be desirable low electrical resistance at these contacts. It is further recognized that the presently espoused use of Schottky metalization, i.e., the herein disclosed titanium platinum gold or titanium gold metal system for example for this ohmic contact function, may be considered an area of device performance compromise, compromise in that somewhat higher source and drain contact resistance can result. With the herein disclosed arrangement of the ohmic contact semiconductor layers of the transistor this tendency toward greater contact resistance is however, limited to a degree believed acceptable in many field-effect transistor uses.

The reward for acceptance of any compromise of this nature is of course realized in the simplification of device processing, probably increased wafer yields and the resulting decrease in device cost. The employment of a single metalization step is of course a notable area of present processing simplification. A significant enabling factor in achieving this single metalization involves use of the relatively inert secondary mask element and the separation of gate region fabrications steps from source and drain region fabrication steps.

Another area of present processing simplification which may be viewed as the acceptance of device-impacting compromise resides in the area of combined electron beam and optical lithography steps in a single device. While conventional wisdom may suggest the maintenance of separation between processes involving these two exposure arrangements is desirable to avoid their compromising interaction, the present inventors believe the combination of these exposures as disclosed herein and in the literature is sufficiently well tuned so as to have no adverse effect on the resulting devices.

Another present process enhancement concerns a selective gate recess etch, which allows for unusually desirable control of the gate etch. Typically, gate recess etching is performed in an iterative, "etch to a target current" process. The present SLIMFET process however, discloses a gate etch that can be accomplished without probing the ohmic contacts and thereby allows the ohmic contacts to be covered with protective material during the gate recess etch. Additionally, the SLIMFET process prevents problems with metal step coverage or metal to metal overlap, problems whose elimination relate closely to yield improvement.

Another feature of the disclosed fabrication is the use of a non-alloyed ohmic contact process which further improves device uniformity and eliminates an undesirable high temperature processing sequence. The SLIMFET process also requires only one dielectric deposition step instead of two as in the best existing technique. Metal definition in the disclosed SLIMFET process is by lift-off and not by the more expensive ion milling. This metal lift-off requires no expensive equipment, and does not introduce damage or transistor performance degradation. Finally the employed process for this device is also compatible with monolithic microwave integrated circuit (MMIC) and other fabrication techniques and minimizes process variations, cycle time, and cost.

Figure 2:
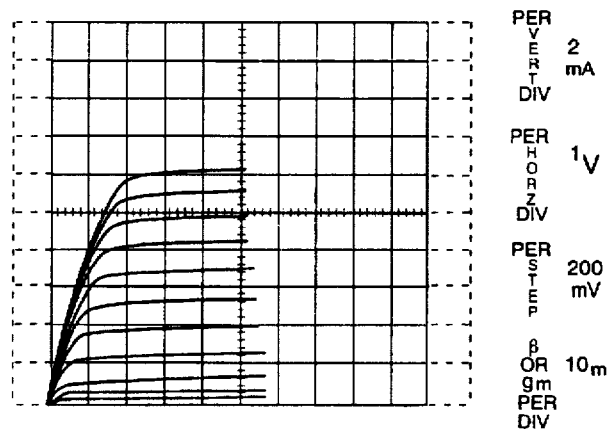
FIG. 2 shows a set of electrical characteristics for a transistor device according to the invention.

The present invention is therefore believed to represent one varriation of the first ever AlGaAs/InGaAs HEMT/PHEMT fabricated using a single layer metalization scheme for both the Schottky gate and ohmic contacts. A device fabricated according to the invention, a device employing the 1.0 micron gate length feature has achieved a transconductance of 140 mS/mm, see FIG. 2 of the drawings. The SLIMFET process is again achieved through the integration of: the electron-beam/optical lithography process, selective gate recess etching, and non-alloyed ohmic contacts. The SLIMFET process greatly simplifies the fabrication of FET devices while minimizing process variations. The described process is also believed feasible for lower frequency amplifier transistors.

While the apparatus and method herein described constitute a preferred embodiment of the invention, it is to be understood that the invention is not limited to this precise form of apparatus or method and that changes may be made therein without departing from the scope of the invention which is defined in the appended claims.

What is claimed is:

1. A single metal contact structure for a group III–V semiconductor material field-effect transistor comprising the combination of:

a lowermost-situated group III–V semiconductor material substrate layer member;

a plurality of grown group III–V semiconductor material layers successively overlaying said substrate layer member, said grown semiconductor material layers including an uppermost selected one of a field-effect transistor channel layer and a barrier layer-covered field-effect transistor channel layer;

a first etch stop semiconductor material layer received over said selected layer;

a gate contact member of first metallic composition received on said selected layer in a gate aperture region of said first etch stop layer, said gate contact member having Schottky barrier electrical characteristics with respect to said selected one of a field-effect transistor channel layer and a barrier layer-covered field-effect transistor channel layer;

a planar layer of ohmic contact semiconductor material overlaying said first etch stop semiconductor material layer-covered selected layer in regions adjacent said gate member;

a second etch stop semiconductor material layer received over said layer of ohmic contact semiconductor material in regions adjacent said gate member;

a secondary mask layer overlaying said layer of ohmic contact semiconductor material in regions surrounding said gate aperture region and said source and drain members, said secondary mask layer also being comprised of group III–V semiconductor material;

said semiconductor material layers being of a single crystal nature;

source and drain contact members of said same first metallic composition received on said ohmic contact semiconductor material layer in aligned source and drain apertures through said secondary mask layer and said second etch stop layer in laterally opposed locations with respect to said gate aperture region, said source and drain contact members having non-alloyed ohmic contact electrical characteristics with respect to said semiconductor material of said ohmic contact layer.

2. The single metal contact structure of claim 1 wherein said group III–V semiconductor material is gallium arsenide and said secondary mask layer is also comprised of gallium arsenide material.

3. The single metal contact structure of claim 1 wherein said gate contact member has a charge carrier-traversed length between one tenth and ten microns.

4. The single metal contact structure of claim 3 wherein said field-effect transistor is a metal semiconductor field-effect transistor and said uppermost selected one of a field-effect transistor channel layer and a barrier layer-covered field-effect transistor channel layer comprises a gallium arsenide field-effect transistor channel layer.

5. The single metal contact structure of claim 3 wherein said field-effect transistor is a high electron mobility field-effect transistor and said uppermost selected one of a field-effect transistor channel layer and a barrier layer-covered field-effect transistor channel layer comprises a gallium arsenide barrier layer-covered field-effect transistor channel layer.

6. The single metal contact structure of claim 3 further including a layer of graded doping concentration gallium arsenide semiconductor material intermediate said first etch stop layer-covered selected layer and said ohmic contact layer in gate aperture-interrupted regions adjacent said gate member.

7. A partially completed contact-included structure for a group III–V semiconductor material, secondary mask-inclusive field-effect transistor comprising the combination of:
   a transistor-divided group III–V semiconductor material field-effect transistor wafer having a first thin semiconductor material etch stop layer overlaying a selected one of a semiconductor material channel layer and a channel layer-covering semiconductor material barrier layer, said wafer also having a planar superimposed group III–V semiconductor material-inclusive ohmic connection layer that is overlaid by a second thin semiconductor material etch stop layer and then a group III–V semiconductor material-inclusive permanent secondary mask layer;
   said semiconductor material layers being of a single crystal nature;
   a photoresist mask layer covering said group III–V semiconductor material-inclusive permanent secondary mask layer;
   a gate window recess disposed in a transistor-divided region of said wafer and extending through said photoresist mask layer, said permanent secondary mask layer, said second etch stop layer, said ohmic connection layer and said first etch stop layer to said selected one of a channel layer and a channel layer-covering barrier layer;
   source and drain region openings disposed in said transistor-divided region on opposed lateral sides of said gate window recess and extending through said photoresist mask layer, said secondary mask layer and said second etch stop layer to said ohmic connection layer;
   a Schottky barrier metal electrical contact received in said gate window recess on said selected one of a channel layer and a channel layer-covering barrier layer;
   a non-alloyed ohmic source electrical contact of said same Schottky barrier metal received on said ohmic connection semiconductor material layer in said source location;
   a non-alloyed ohmic drain electrical contact of said same Schottky barrier metal received on said ohmic connection semiconductor material layer in said drain location; and
   a removable region of superfluous same Schottky barrier metal received on said photoresist mask layer surrounding said gate window recess, said source location and said drain location.

8. The partially completed contact-included transistor structure of claim 7 wherein said gate window recess includes a gate aperture region immediately adjacent said selected one of a channel layer and a channel layer-covering barrier layer and said gate aperture region has smallest feature dimensions of less than six tenths micron.

9. The partially completed contact-included transistor structure of claim 7 wherein said gate window recess includes a gate aperture region immediately adjacent said selected one of a channel layer and a channel layer-covering barrier layer and said gate aperture region has smallest feature dimensions of greater than six tenths micron.

10. The partially completed contact-included transistor structure of claim 7 wherein said group III–V semiconductor material is comprised of gallium arsenide material.

11. The partially completed contact-included transistor structure of claim 10 wherein said first and second thin semiconductor material etch stop layers have layer thickness of less than seventy angstroms.

12. The partially completed contact-included transistor structure of claim 11 wherein said first and second thin semiconductor material etch stop layers are comprised of aluminum arsenide material and have layer thickness of thirty and fifty angstroms respectively.

13. The partially completed contact-included transistor structure of claim 7 wherein said permanent secondary mask layer is comprised of undoped gallium arsenide material.

14. The partially completed contact-included transistor structure of claim 7 wherein said Schottky barrier metal electrical contact received in said gate window recess is disposed in a mushroom cross-sectioned configuration.

15. The partially completed contact-included transistor structure of claim 7 wherein said ohmic connection layer material is comprised of indium gallium and arsenic materials and said ohmic connection layer material is doped with silicon.

16. The partially completed contact-included transistor structure of claim 15 wherein said Schottky barrier metal is one of the alloys of titanium platinum gold and platinum gold.

17. The partially completed contact-included transistor structure of claim 7 wherein said selected one of a channel layer and a channel layer-covering barrier layer is a channel layer-covering barrier layer and said transistor is a high electron mobility field-effect transistor.

18. The partially completed contact-included transistor structure of claim 7 wherein said selected one of a channel layer and a channel layer-covering barrier layer is a channel layer-covering barrier layer and said transistor is a pseudomorphic high electron mobility transistor.

19. The partially completed contact-included transistor structure of claim 7 wherein:

said selected one of a channel layer and a channel layer-covering barrier layer is a channel layer; and said channel layer is comprised of doped gallium arsenide material; and said transistor is a metal semiconductor metal (MESFET) transistor.

20. A partially completed contact-included structure for a group III-V semiconductor material, secondary mask-inclusive metal semiconductor metal field-effect transistor, a MESFET, comprising the combination of:

a transistor-divided group III-V semiconductor material field-effect transistor wafer having a doped channel layer and a channel layer-covering group III-V semiconductor material-inclusive planar ohmic connection layer covering said channel layer and having a group III-V semiconductor material-inclusive permanent secondary mask layer covering said ohmic connection layer;

a photoresist mask layer covering said group III-V semiconductor material-inclusive permanent secondary mask layer;

a gate window recess disposed in a transistor-divided region of said wafer and extending through said photoresist mask layer, said permanent secondary mask layer, and said ohmic connection layer to said channel layer;

source and drain region openings disposed in said transistor-divided region on opposed lateral sides of said gate window recess and extending through said photoresist mask layer, and said secondary mask layer to said ohmic connection layer;

a Schottky barrier metal electrical contact received in said gate window recess on said channel layer;

a non-alloyed ohmic source electrical contact of said same Schottky barrier metal received on said ohmic connection semiconductor material layer in said source location;

a non-alloyed ohmic drain electrical contact of said same Schottky barrier metal received on said ohmic connection semiconductor material layer in said drain location; and a removable region of superfluous same Schottky barrier metal received on said photoresist mask layer surrounding said gate window recess, said source location and said drain location.

21. The partially completed contact-included structure of claim 20 further including first and second semiconductor material etch stop layers immediately covered by and covering said ohmic connection layer respectively.

22. The partially completed contact-included transistor structure of claim 7 wherein said gate contact member includes dimensions between 0.05 and 0.60 micron.

* * * * *

UNITED STATES PATENT AND TRADEMARK OFFICE
CERTIFICATE OF CORRECTION

PATENT NO.    : 5,698,900
DATED         : December 16, 1997
INVENTOR(S)   : Christopher A. Bozada et al.

It is certified that error appears in the above-identified patent and that said Letters Patent is hereby corrected as shown below:

Title page,
Item [57] ABSTRACT,
Line 1, "III-IV" should read -- III-V --.

Signed and Sealed this

Second Day of April, 2002

Attest:

JAMES E. ROGAN
*Attesting Officer*      *Director of the United States Patent and Trademark Office*